United States Patent [19]

Hong

[11] Patent Number: 5,768,078
[45] Date of Patent: Jun. 16, 1998

[54] ELECTROSTATIC DISCHARGE PROTECTION CIRCUIT

[75] Inventor: Hyeong Sun Hong, Kyoungki-do, Rep. of Korea

[73] Assignee: Hyundai Electronics Industries Co., Ltd., Ichon, Rep. of Korea

[21] Appl. No.: 747,130

[22] Filed: Nov. 12, 1996

[30] Foreign Application Priority Data

Nov. 13, 1995 [KR] Rep. of Korea ............. 95-41040

[51] Int. Cl.[6] .................................................. H02H 9/00
[52] U.S. Cl. ........................... 361/56; 361/111; 361/118
[58] Field of Search ............................. 361/18, 56, 58, 361/111, 113, 115, 118, 127

[56] References Cited

U.S. PATENT DOCUMENTS

| | | | |
|---|---|---|---|
| 4,760,433 | 7/1988 | Young et al. | 357/23.13 |
| 4,990,802 | 2/1991 | Smooha | 307/482.1 |
| 5,041,894 | 8/1991 | Reczek | 357/42 |
| 5,381,056 | 1/1995 | Murphy | 361/91 |
| 5,455,543 | 10/1995 | Cheng | 257/356 |
| 5,546,020 | 8/1996 | Lee et al. | 326/83 |

*Primary Examiner*—Jeffrey A. Gaffin
*Assistant Examiner*—Stephen Jackson
*Attorney, Agent, or Firm*—Reid & Priest LLP

[57] ABSTRACT

An electrostatic discharge protection circuit comprising a first transistor formed on a semiconductor substrate adjacently to one side of an insulation oxide film region, for transferring a voltage from a first voltage terminal to an output terminal in response to a first input signal, a second transistor formed on the semiconductor substrate adjacently to the other side of the insulation oxide film region, for transferring a voltage form a second input signal, and an NPN transistor having its collector connected to the first voltage terminal, its emitter connected to the output terminal and its base connected to a bulk region of the second transistor. According to the present invention, when a semiconductor device is exposed to electrostatic discharge, the electrostatic discharge protection circuit discharges charges introduced by the electrostatic discharge before they are discharge through an internal circuitry. Therefore, due to the electrostatic discharge, the internal circuitry can be prevented from being damaged.

16 Claims, 5 Drawing Sheets

1

ELECTROSTATIC DISCHARGE PROTECTION CIRCUIT

BACKGROUND OF THE INVENTION

1. Field of the Invention

The present invention relates in general to a semiconductor device, and more particularly to an electrostatic discharge protection circuit for protecting the circuitry from external sudden electrostatic discharge.

2. Description of the Prior Art

FIG. 1 is a circuit diagram illustrating the construction of a conventional data output buffer, exposed to electrostatic discharge. As shown in this drawing, the conventional data output buffer comprises a pull-up transistor MN1 for transferring a supply voltage Vcc from a supply voltage terminal (referred to hereinafter as Vcc terminal) to an output terminal OUT in response to a data input signal from an input terminal IN, and a pull-down transistor MN2 for transferring a ground voltage Vss terminal) to the output terminal OUT in response to the data input signal from the input terminal IN.

In the conventional data output buffer with the above-mentioned construction, the pull-up transistor MN1 or the pull-down transistor MN2 is operated in response to the data input signal from the input terminal IN to transfer the supply voltage Vcc from the Vcc terminal or the ground voltage Vss from the Vss terminal to the output terminal OUT.

FIG. 2 is a view illustrating a layout of the pull-up or pull-down transistor MN1 or MN2 in FIG. 1. In this drawing, the reference numeral 1 designates a source region of the transistor, the reference numeral 2 designates a drain region of the transistor, and the reference numeral 3 designates a gate region of the transistor. Also the reference numeral 4 designates the boundary between an active region of the transistor and an insulation oxide film, and the reference numeral 5 designates an impurity implanted region in the active region of the transistor.

Generally, if a semiconductor device is exposed to electrostatic discharge, the circuitry therein is damaged, resulting in the faulty operation of the device or decreased reliability. The reason is that junction spiking, oxide film breakdown and etc. occur at vulnerable areas due to Joule heat which is produced as charges introduced through the input terminal by the electrostatic discharge are finally discharged to other terminals through the internal circuitry.

In the conventional data output buffer as shown in FIG. 1, the pull-up and pull-down transistors have wide channel widths to prevent the damage of the internal circuitry due to the electrostatic discharge. As a result, most of the charges introduced by the electrostatic discharge are discharged through punchthrough or junction breakdown of the transistors.

However, in the case where the transistors themselves are not designed strongly, they may break down due to the electrostatic discharge, resulting in the production of leakage current which may exert a serious effect on the reliability of the semiconductor device.

SUMMARY OF THE INVENTION

Therefore, the present invention has been made in view of the above problem, and it is an object of the present invention to provide an electrostatic discharge protection circuit which is capable of, when a semiconductor device is exposed to electrostatic discharge, discharging charges introduced through a supply voltage terminal by the electrostatic discharge to an output terminal before they are discharged through an internal circuitry, to prevent the internal circuitry from being damaged due to the electrostatic discharge.

It is another object of the present invention to provide a data output buffer having an electrostatic discharge protection function which is capable of discharging electrostatic charges produced at an output terminal or a supply voltage terminal to a ground voltage terminal to prevent the internal circuitry from being damaged due to the electrostatic discharge.

In accordance with one aspect of the present invention, an electrostatic discharge protection circuit comprises a first transistor formed on a semiconductor substrate adjacently to one side of an insulation oxide film region, for transferring a voltage from a first voltage terminal to an output terminal in response to a first input signal; a second transistor formed on the semiconductor substrate adjacently to the other side of the insulation oxide film region, for transferring a voltage from a second voltage terminal to the output terminal in response to a second input signal; and an NPN transistor having its collector connected to the first voltage terminal, its emitter connected to the output terminal and its base connected to a bulk region of the second transistor.

In accordance with another aspect of the present invention, there is provided an electrostatic discharge protection circuit comprising a first transistor formed on a semiconductor substrate adjacently to one side of an insulation oxide film region, for transferring a voltage form a first voltage terminal to an output terminal in response to a first input signal; a second transistor formed on the semiconductor substrate adjacently to the other side of the insulation oxide film region, for transferring a voltage from a second voltage terminal to the output terminal in response to a second input signal; and an NPN transistor having its emitter connected to the second voltage terminal, its collector connected to the output terminal and its base connected to a bulk region of the second transistor.

In accordance with yet another aspect of the present invention, an electrostatic discharge protection circuit comprises a first transistor formed on a semiconductor substrate adjacently to one side of an insulation oxide film region, for transferring a voltage from a first voltage terminal to an output terminal in response to a first input signal; a second transistor formed on the semiconductor substrate adjacently to the other side of the insulation oxide film region, for transferring a voltage from a second voltage terminal to the output terminal, its emitter connected to the second voltage terminal and its base connected to a bulk region of the second transistor.

BRIEF DESCRIPTION OF THE DRAWINGS

The above and other objects, features and advantages of the present invention will be more clearly understood from the following detailed description taken in conjunction with the accompanying drawings, in which.

3

Figure 3:
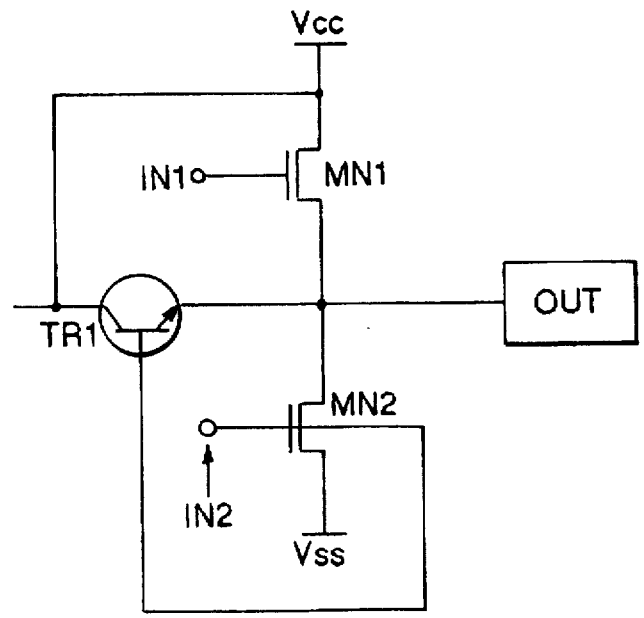
FIG. 3 is a circuit diagram illustrating the construction of a data output buffer in accordance with a first embodiment of the present invention.
Figure 5:
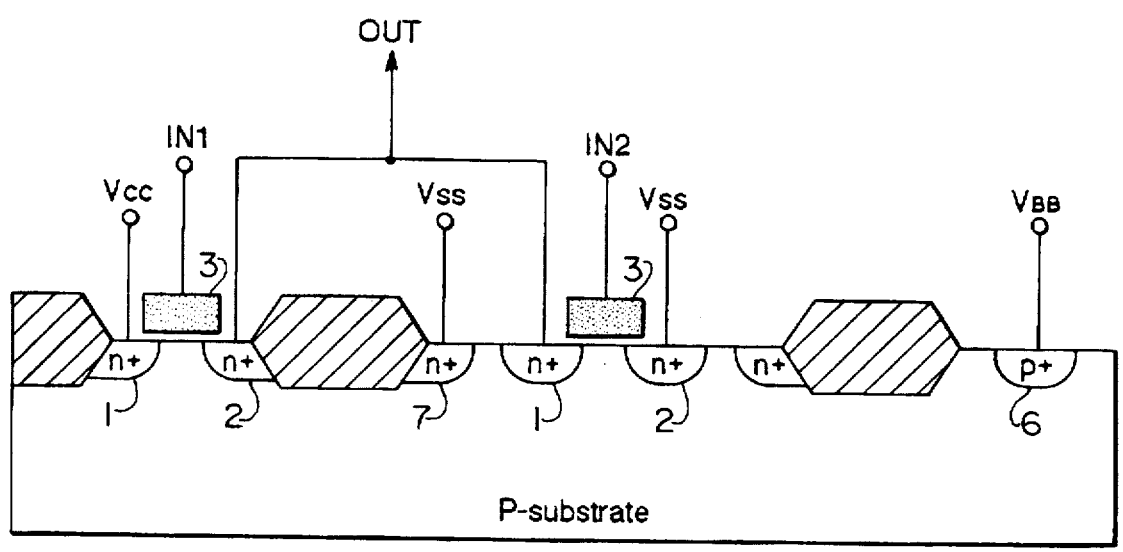
Figure 6:
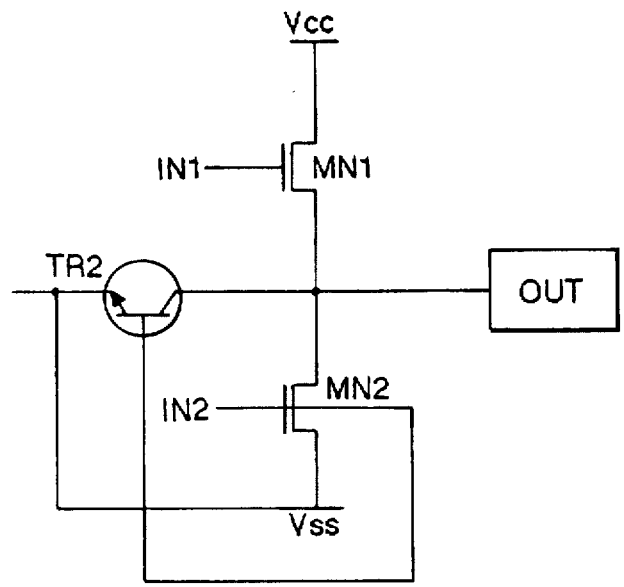
Figure 7:
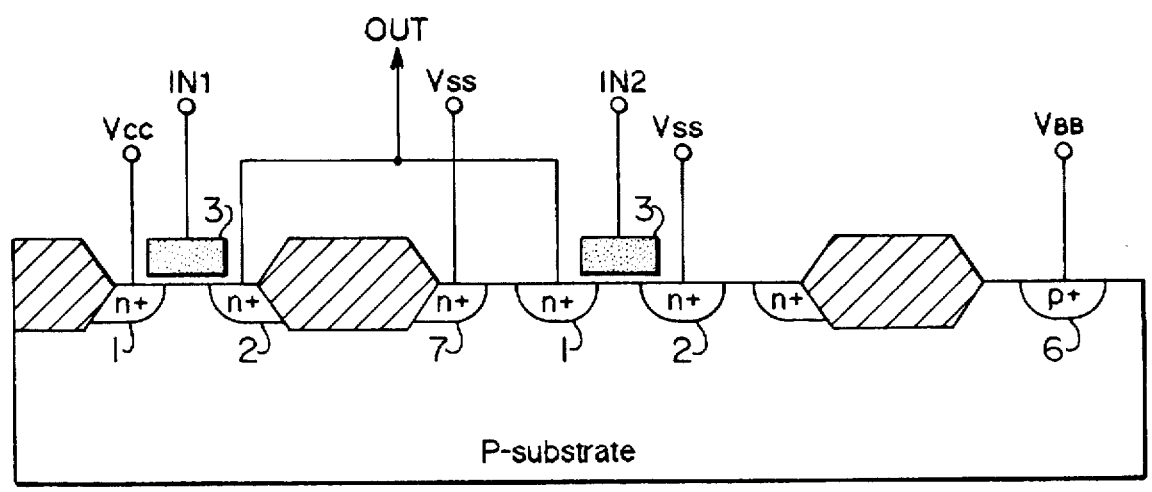
Figure 8:
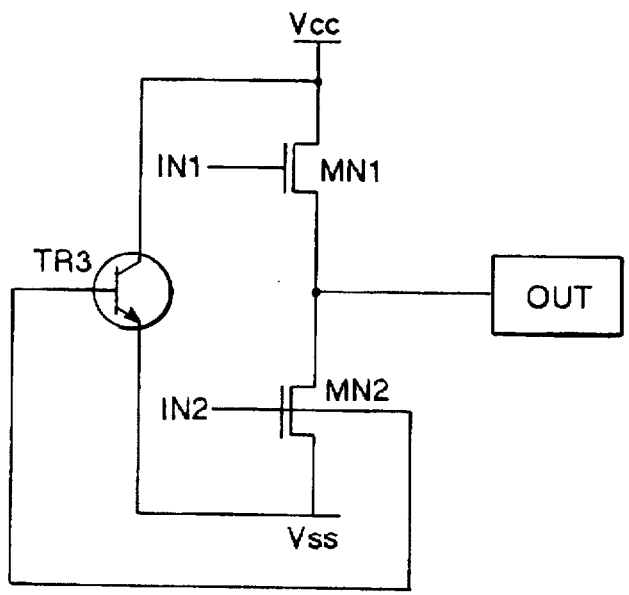
Figure 9:
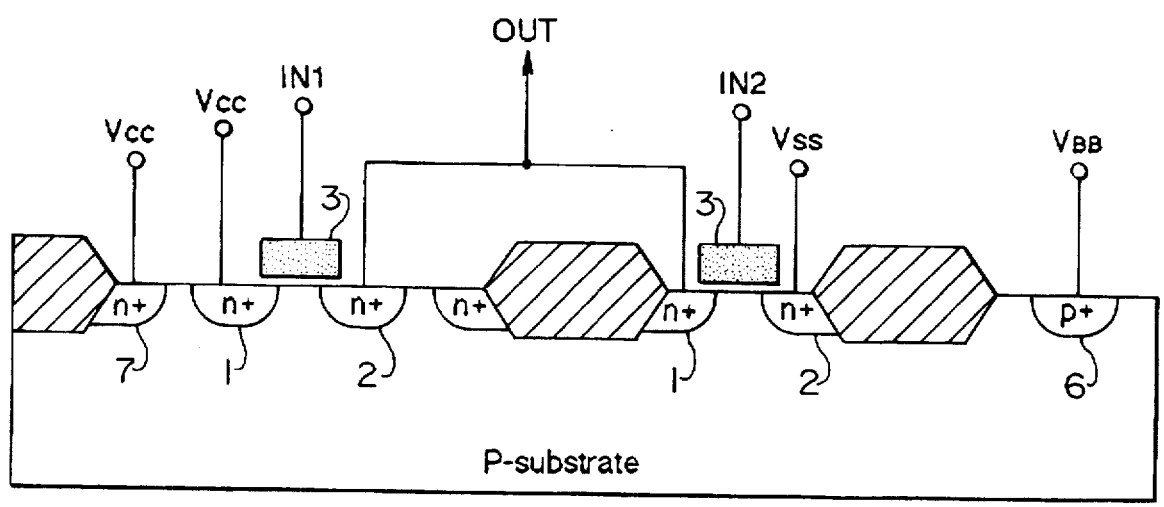

FIG. 5 is a sectional view illustrating the construction of the date output buffer in FIG. 3;

FIG. 6 is a circuit diagram illustrating the construction of a data output buffer in accordance with a second embodiment of the present invention;

FIG. 7 is a sectional view illustrating the construction of the data output buffer in FIG. 6:

FIG. 8 is a circuit diagram illustrating the construction of a data output buffer in accordance with a third embodiment of the present invention; and FIG. 9 is a sectional view illustrating the construction of the data output buffer in FIG. 8.

DETAILED DESCRIPTION OF THE PREFERRED EMBODIMENTS

FIG. 3 is a circuit diagram illustrating the construction of a data output buffer in accordance with a first embodiment of the present invention. A shown in this drawing, the data output buffer comprises a pull-up transistor MN1 for transferring a supply voltage Vcc from a Vcc terminal to an output terminal OUT in response to an input signal IN1 being applied to a gate thereof, a pull-down transistor MN2 for transferring a ground voltage Vss from a Vss terminal to the output terminal OUT in response to an input signal IN2 being applied to a gate thereof, and an NPN transistor Tr1 for discharging electrostatic charges introduced through the Vcc terminal to the output terminal OUT. The NPN transistor TR1 has its emitter connected to the output terminal OUT, its collector connected to the Vcc terminal and its base connected to a bulk of the pull-down transistor MN2.

In the data output buffer with the above-mentioned construction, if electrostatic charges are introduced through the Vcc terminal, the NPN type bipolar transistor TR1 is turned on to discharge the introduced electrostatic charges to the output terminal OUT. As a result, the pull-up and pull-down transistors MN1 and MN2 are prevented from being damaged due to the external electrostatic discharge.

Figure 1:
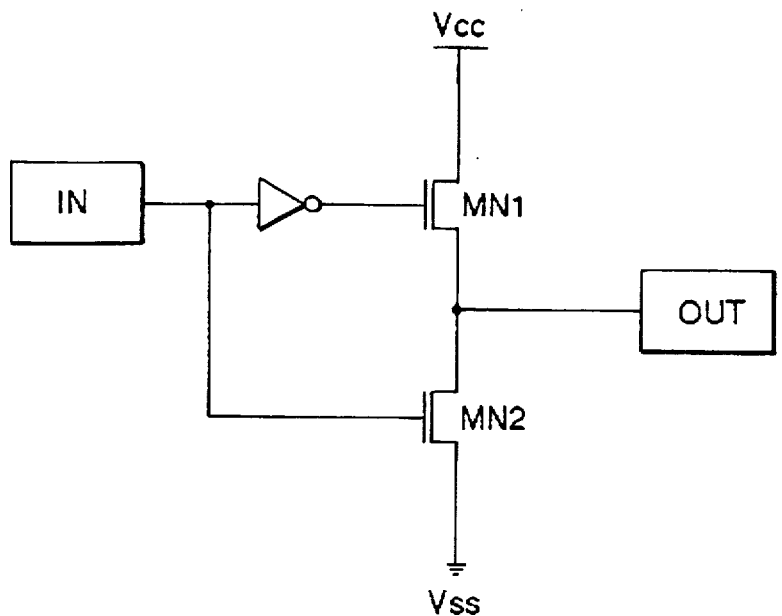
FIG. 1 is a circuit diagram illustrating the construction of a conventional data output buffer, exposed to electrostatic discharge.
Figure 2:
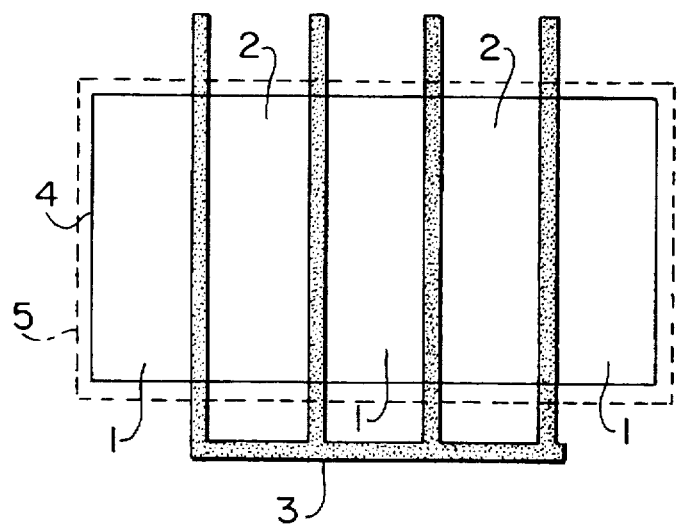
FIG. 2 is a view illustrating a layout of a pull-up or pull-down transistor in FIG. 1.
Figure 4:
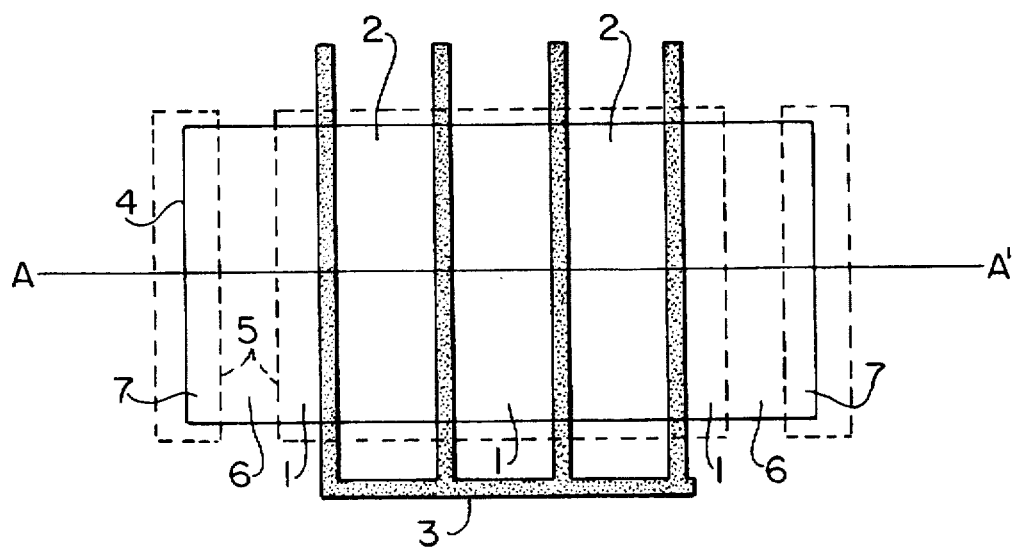
FIG. 4 is a view illustrating a layout of a pull-up of pull-down transistor in FIG. 3.

FIG. 4 is a view illustrating a layout of the pull-up or pull-down transistor MN1 or MN2 in FIG. 3. As shown in this drawing, the donor or accepter impurity (i.e., $N^+$ or $P^-$ source/drain ion impurity) implanted into the active region in FIG. 2 is divided into an input terminal node region 1, a base region 6 and a collector region 7 of the bipolar transistor to form the bipolar transistor. Noticeably, in the case where only one wide gate is provided in the pull-up or pull-down transistor, it is extremely lengthened. For this reason, it is preferred that the gate of the pull-up or pull-down transistor is formed by connecting several narrow regions in parallel. In this connection, the gate 3 of the pull-up or pull-down transistor is divided into four regions.

FIG. 5 is a sectional view illustrating the construction of the data output buffer in FIG. 3. In this drawing, the reference numeral 1 designates a drain region of the pull-up or pull-down transistor, the reference numeral 2 designates a source region of the pull-up or pull-down transistor, and the reference numeral 3 designates a gate region of the pull-up or pull-down transistor. Also, the reference numeral 6 designates a base region of the bipolar transistor, and the reference numeral 7 designates a collector region of the bipolar transistor. For avoiding confusion, the description will hereinafter be made on the assumption that one gate region is provided in the pull-up or pull-down transistor.

For the manufacturing procedure, an insulating oxide film is formed on an inactive region of a substrate through a field oxidation process, and a polysilicon film is formed on an active region of the substrate. A gate electrode is then formed through light exposure/development processes by using a gate electrode mask. Then, source/drain and base/collector electrodes which are impurity junction regions are separately formed on the substrate by using the gate electrode and insulation film as masks.

In this manner, in the date output buffer shown in FIG. 3, the pull-up transistor MN1 has its source 1 connected to the Vcc terminal, its drawing 2 connected to the output terminal OUT and its gate 3 connected to the input terminal IN1. Also, the pull-down transistor MN2 has its source 1 connected to the output terminal OUT, its drain 2 connected to the Vss terminal and its gate 3 connected to the input terminal IN2. Further, the NPN type bipolar transistor TR1 has its emitter 1 connected to the output terminal OUT, its collector 7 connected to the Vcc terminal and its base 6 connected to the bulk of the pull-down transistor MN2.

FIG. 6 is a circuit diagram illustrating the construction of a data output buffer in accordance with a second embodiment of the present invention. As shown in this drawing, the data output buffer comprises a pull-up transistor MN1 for transferring a supply voltage Vcc from a Vcc terminal to an output terminal OUT in response to an input signal IN1 being applied to a gate thereof, a pull-down transistor MN2 for transferring a ground voltage Vss from a Vss terminal to the output terminal OUT in response to an input signal IN2 being applied to a gate thereof, and an NPN transistor TR2 for discharging electrostatic charges introduced through the output terminal OUT to the Vss terminal. The NPN transistor TR2 has its emitter connected to the output terminal OUT, its collector connected to the Vss terminal and its base connected to a bulk of the pull-down transistor MN2.

In the data output buffer with the above-mentioned construction, if electrostatic charges are introduced through the output terminal OUT, the NPN type bipolar transistor TR2 is turned on to discharge the introduced electrostatic charges to the Vss terminal. As a result, the pull-up and pull-down transistors MN1 and MN2 are prevented from being damaged due to the external electrostatic discharge.

FIG. 7 is a sectional view illustrating the construction of the data output buffer in FIG. 6. As shown in this drawing, the pull-up transistor MN1 has its drawing 1 connected to the Vcc terminal, its source 2 connected to the output terminal OUT and its gate 3 connected to the input terminal IN1. Also, the pull-down transistor MN2 has its drain 1 connected to the output terminal OUT, its source 2 connected to the Vss terminal and its gate 3 connected to the input terminal IN2. Further, the NON type bipolar transistor TR2 has its collector 1 connected to the output terminal OUT, its emitter 7 connected to the Vss terminal and its base 6 connected to the bulk of the pull-down transistor MN2.

FIG. 8 is a circuit diagram illustrating the construction of a data output buffer in accordance with a third embodiment of the present invention. As shown in this drawing, the data output buffer comprises a pull-up transistor MN1 for transferring a supply voltage Vcc from a Vcc terminal to an output terminal OUT in response to an input signal IN1 being applied to a gate thereof, a pull-down transistor MN2 for transferring a ground voltage Vss from a Vss terminal to the output terminal OUT in response to an input signal IN2 being applied to a gate thereof, and an NPN transistor TR3 for discharging electrostatic charges introduced through the Vcc terminal to the Vss terminal. The NPN transistor TR3 has its emitter connected to the Vcc terminal, its collector connected to the Vss terminal and its base connected to a bulk of the pull-down transistor MN2.

In the data output buffer with the above-mentioned construction, if electrostatic charges are introduced through the Vcc terminal, the NPN type bipolar transistor TR3 is turned on to discharge the introduced electrostatic charges to the Vss terminal. As a result, the pull-up and pull-down transistors MN1 and MN2 are prevented from being damaged due to the external electrostatic discharge.

FIG. 9 is a sectional view illustrating the construction of the data output buffer in FIG. 8. As shown in this drawing, the pull-up transistor MN1 has its drain 1 connected to the Vcc terminal, its source 2 connected to the output terminal OUT and its gate 3 connected to the input terminal IN1. Also, the pull-down transistor MN2 has its drain 1 connected to the output terminal OUT, its source 2 connected to the Vss terminal and its gate 3 connected to the input terminal IN2. Furthermore, the NPN type bipolar transistor TR3 has its collector 1 connected to the Vcc terminal, its emitter 7 connected to the Vss terminal and its base 6 connected to the bulk of the pull-down transistor MN2.

As is apparent from the above description, according to the present invention, the electrostatic discharge protection circuit can discharge electrostatic charges applied from the outside of the semiconductor device. Therefore, the semiconductor device can be prevented from being damaged due to the electrostatic charges.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An electrostatic discharge protection circuit comprising:
   a first transistor formed on a semiconductor substrate adjacent to one side of an insulation oxide film region, for transferring a voltage from a first voltage terminal to an output terminal in response to a first input signal;
   a second transistor formed on said semiconductor substrate adjacent to the other side of said insulation oxide film region, for transferring a voltage from a second voltage terminal to said output terminal in response to a second input signal; and
   an NPN transistor having its collector connected to said first voltage terminal, its emitter connected to said output terminal and its base connected to a bulk region of said second transistor.

2. An electrostatic discharge protection circuit as set forth in claim 1, wherein said voltage terminal is a supply voltage terminal, said second voltage terminal is a ground voltage terminal, said first and second transistors are MOS transistors and said NPN transistor is formed between said insulation oxide film region and said second transistor.

3. An electrostatic discharge protection circuit as set forth in claim 2, wherein said first and second transistors are NMOS transistors, said first transistor having its drawing connected to said first voltage terminal and its gate for receiving the first input signal, said second transistor having its source connected to said second voltage terminal, its gate for receiving the second input signal and its drain commonly used as said emitter of said NPN transistor.

4. An electrostatic discharge protection as set forth in claim 1, wherein said first voltage terminal is a supply voltage terminal, said second voltage terminal is a ground voltage terminal, said first and second transistors are MOS transistors and said NPN transistor is formed between said insulation oxide film region and said first transistor.

5. An electrostatic discharge protection circuit as set forth in claim 4, wherein said first and second transistors are NMOS transistors, said first transistor having its drain connected to said first voltage terminal, its gate for receiving the first input signal and its source commonly used as said emitter of said NPN transistor, said second transistor having its source connected to said second voltage terminal and its gate for receiving the second input signal.

6. An electrostatic discharge protection circuit as set forth in claim 5, wherein said semiconductor substrate is a P type substrate and said base of said NPN transistor is a portion of a bulk region of said semiconductor substrate.

7. An electrostatic discharge protection circuit comprising:
   a first transistor formed on a semiconductor substrate adjacent to one side of an insulation oxide film region, for transferring a voltage from a first voltage terminal to an output terminal in response to a first input signal;
   a second transistor formed on said semiconductor substrate adjacent to the other side of said insulation oxide film region, for transferring a voltage from a second voltage terminal to said output terminal in response to a second input signal; and
   an NPN transistor having its emitter connected to said second voltage terminal, its collector connected to said output terminal and its base connected to a bulk region of said second transistor.

8. An electrostatic discharge protection circuit as set forth in claim 7, wherein said first voltage terminal is a supply voltage terminal, said second voltage terminal is a ground voltage terminal, said first and second transistors are MOS transistors and said NPN transistor is formed between said insulation oxide film region and said second transistor.

9. An electrostatic discharge protection circuit as set forth in claim 8, wherein said first and second transistors are NMOS transistors, said first transistor having its drain connected to said first voltage terminal and its gate for receiving the first input signal, said second transistor having its source connected to said second voltage terminal, its gate for receiving the second input signal and its drain commonly used as said collector of said NPN transistor.

10. An electrostatic discharge protection circuit as set forth in claim 7, wherein said first voltage terminal is a supply voltage terminal, said second voltage terminal is a ground voltage terminal, said first and second transistors are MOS transistors and said NPN transistor is formed between said insulation oxide film region and said first transistor.

11. An electrostatic discharge protection circuit as set forth in claim 10, wherein said first and second transistors are NMOS transistors, said first transistor having its drain connected to said first voltage terminal, its gate for receiving the first input signal and its source commonly used as said collector of said NPN transistor, said second transistor having its source connected to said second voltage terminal and its gate for receiving the second input signal.

12. An electrostatic discharge protection circuit as set forth in claim 11 or, wherein said semiconductor substrate is a P type substrate and said base of said NPN transistor is a portion of a bulk region of said semiconductor substrate.

13. An electrostatic discharge protection circuit comprising:
   a first transistor formed on a semiconductor substrate adjacent to one side of an insulation oxide film region, for transferring a voltage from a first voltage terminal to an output terminal in response to a first input signal;
   a second transistor formed on said semiconductor substrate adjacent to the other side of said insulation oxide film region, for transferring a voltage from as second voltage terminal to said output terminal in response to a second input signal; and an NPN transistor having its collector connected to said first voltage terminal, its emitter connected to said second voltage terminal and its base connected to a bulk region of said second transistor.

14. An electrostatic discharge protection circuit as set forth in claim 13, wherein said first voltage terminal is a supply voltage terminal, said second voltage terminal is a ground voltage terminal, said first and second transistors are MOS transistors and said NPN transistor is formed adjacently to said first transistor.

15. An electrostatic discharge protection circuit as set forth in claim 14, wherein said first and second transistors are NMOS transistors, said first transistor having its drain connected to said first voltage terminal and commonly used as said collector of said NPN transistor and its gate for receiving the first input signal, said second transistor having its source connected to said second voltage terminal and its gate for receiving the second input signal.

16. An electrostatic discharge protection circuit as set forth in claim 15, wherein said semiconductor substrate is a P type substrate and said base of said NPN transistor is a portion of a bulk region of said semiconductor substrate.

* * * * *